(12) United States Patent
Aigner et al.

(10) Patent No.: US 6,471,920 B2
(45) Date of Patent: Oct. 29, 2002

(54) APPARATUS AND METHOD FOR TREATMENT OF ELECTRICALLY CONDUCTIVE CONTINUOUS MATERIAL

(75) Inventors: Hans-Jörg Aigner, Graz (AT); Helmut Jäger, Hausmannstätten (AT)

(73) Assignee: Mag Maschinen Und Apparatebau Aktiengesellschaft, Graz (AT)

( * ) Notice: Subject to any disclaimer, the term of this patent is extended or adjusted under 35 U.S.C. 154(b) by 0 days.

(21) Appl. No.: 09/673,943

(22) PCT Filed: Feb. 23, 2000

(86) PCT No.: PCT/EP00/01490

§ 371 (c)(1),
(2), (4) Date: Oct. 24, 2000

(87) PCT Pub. No.: WO00/50667

PCT Pub. Date: Aug. 31, 2000

(65) Prior Publication Data

US 2001/0026781 A1 Oct. 4, 2001

(30) Foreign Application Priority Data

Feb. 24, 1999 (DE) ......................................... 199 07 911

(51) Int. Cl.[7] .................................................. B01J 19/08
(52) U.S. Cl. ............. 422/186.05; 204/164; 204/192.32; 204/298.35
(58) Field of Search ..................... 422/186.05; 204/164, 204/192.32, 298.35

(56) References Cited

U.S. PATENT DOCUMENTS 3,654,108 A  4/1972 Smith .......................... 204/164
4,935,115 A  * 6/1990 Chambaere et al. ... 204/298.35
5,948,294 A    9/1999 Gordon ........................ 219/123
5,981,904 A  * 11/1999 Gordon ........................ 219/123

FOREIGN PATENT DOCUMENTS

| EP | 0 270 144 | 6/1988 |
| EP | 0 313 154 | 4/1989 |
| FR | 2 774 400 | 8/1999 |
| GB | 948554 | 2/1964 |
| JP | 53-57134 | 5/1978 |
| JP | 54-1242 | 1/1979 |
| JP | 55-76019 | 6/1980 |
| SU | 1227280 A1 | 4/1986 |
| WO | WO 96/38311 | 12/1996 |
| WO | WO 99/28520 | 6/1999 |

* cited by examiner

Primary Examiner—Kishor Mayekar
(74) Attorney, Agent, or Firm—Fish & Richardson P.C.

(57) ABSTRACT

An apparatus for treatment of electrically conductive continuous material, like wire material, copper wire in particular, is proposed, wherein the treatment is effected during the movement of the continuous material in its direction of extension through the apparatus. The apparatus can be used for heating, annealing or surface cleaning of the continuous material. The apparatus includes contact. means for creating an electrical contact with the moved continuous material and an electrode arrangement arranged with a distance to the continuous material and at least partly encompassing it, wherein in a gas discharge chamber located between the continuous material and the electrode arrangement and filled with a reaction gas an electrical gas discharge can be generated by applying an electrical voltage between the contact means 5 and said electrode arrangement for treatment of the continuous material.

20 Claims, 2 Drawing Sheets

APPARATUS AND METHOD FOR TREATMENT OF ELECTRICALLY CONDUCTIVE CONTINUOUS MATERIAL

This application is a 35 U.S.C. 371 National Stage application of International application PCT/EP00/01490 filed Feb. 23, 2000.

BACKGROUND OF THE INVENTION

The invention relates to an apparatus and a method for treatment, cleaning and/or heating in particular, of electrically conductive continuous material during the movement in direction of extension thereof.

A known apparatus of this kind is used for soft-annealing the wire material prior to a method step for diameter reduction of the wire material by transformation by means of drawing of the wire material. Furtheron, the known apparatus is used for cleaning the wire material prior to being coated with an insulating material in order to permit good adhesion of the insulating material which e.g. is applied by varnishing. The known apparatus includes an annealing furnace formed as tube through which the continuous material is transferred. The tube e.g. is heated by resistance heating and by radiation or convection transmits heat to the continuous material moved therethrough, for soft-annealing the latter. Furtheron, during said heating impurities vaporize on the surface of the continuous material and this cleaning effect can be supported in that in the furnace a particular gas atmosphere, e.g. steam, is maintained.

For achieving a desired heating of the wire material, said wire material has to dwell a given period of time in the furnace. If the moving speed of the continuous material is to be increased for increasing the throughput of the apparatus, the length of the apparatus has to be increased correspondingly. An advantage of the known apparatus thus lies in its increased spatial requirement as well as the increase energy demand for heating the furnace with increased throughput.

SUMMARY OF THE INVENTION

It is the object of the present invention to create an apparatus for treatment of continuous material of the above-described kind, which permits efficient treatment also in case of increased moving speeds of the continuous material.

In accordance with the present invention an apparatus for treatment of electrically conductive continuous material during its movement through the apparatus in its direction of extension is provided for which includes an electrode arrangement disposed with a distance to the continuous material and at least partly encompassing it. A gas discharge chamber located between the continuous material and the electrode arrangement is filled with reaction gas. Furtheron, a contact means is available for generating an electrical contact with the moving continuous material and by applying an electrical voltage between the contact means and the electrode arrangement a gas discharge can be produced in the gas discharge chamber. This gas discharge generates a plasma in the gas discharge chamber, i.e. electrically charged particles are formed there.

As the continuous material contacted through the contact means herein acts as electrode itself, a portion of the electrically charged particles generated in the reaction gas and accelerated by the voltage directly impinges on the continuous material and exerts the treating effect thereon. Thus, this bombardment with charged particles, of the continuous material can e.g. cause cleaning of the surface of the continuous material and/or heat the continuous material in total.

The apparatus in accordance with the present invention preferably is used for soft-annealing metallic wire material, copper wire in particular, prior to a drawing step for reducing the diameter of the wire material and/or for cleaning the surface of the wire material prior to a coating step for coating the wire material with an insulating material and/or for heating the wire material in total prior to the coating step.

The electrode arrangement preferably comprises a cylinder geometry through which the continuous material extends essentially axially and in straight line. By this an electrode arrangement essentially completely encompassing the continuous material is made available such that a gas discharge uniform about the continuous material in circumferential direction and thus uniform treatment of the material from all sides is achievable. Furtheron, by corresponding dimensioning of the length of the cylinder geometry an intensity of the treatment, harmonized with the moving speed of the continues material through the apparatus can be adjusted.

A pressure deviating from the ambient pressure, of the reaction gas in the gas discharge chamber preferably is adjustable for better control of the gas charge, when a container encompassing the gas discharge chamber in essentially gas-proof manner is provided for. The continuous material enters this container in its movement through the apparatus through an entry lock and exits through an exit lock. The entry lock and/or the exit lock, respectively, provides sufficient sealing function between the container and the moving continuous material and is to permit passage of the continuous material with as low friction as possible.

If the continuous material is a wire, the entry lock and/or the exit lock can be formed by drawing plate as usually used for wire drawing. Such a drawing plate also is referred to as drawing die or drawing hole. The internal diameter therein is harmonized to the outer diameter of the wire such that on one hand essentially no gap exists between the wire and the drawing plate and on the other hand friction between the wire and the drawing plate is as low as possible such that essentially also no reduction of the outer diameter of the wire is effected by deformation during passage through the drawing plate.

In order to preventing ambient air to enter the gas discharge room through the entry lock or the exit lock, respectively, preferably a protective gas chamber is provided for which is limited to the reaction chamber by the entry lock or the exit lock, respectively. Hereby it can be guaranteed that through the respective lock only harmless protective gas enters the gas discharge room. The gas pressure in the protective gas chamber may be lower than in the gas discharge chamber. Preferably, however, the pressure there is higher and the entry of ambient air into the protective gas chamber itself can then be prevented if the pressure there is higher than standard pressure.

The trailing protective gas chamber which the continuous material enters after treatment can also be provided for cooling of the treated continuous material. Then, the protective gas existing in the protective gas chamber preferably is cooled itself and/or preferably is under increased pressure for intensivation of heat transfer from the continuous material.

Furtheron, for cooling of the treated continuous material a liquid bath, a water bath in particular, can be provided for into which the continuous material enters directly after treatment in the gas discharge chamber. Preferably, however, the treated continuous material enters the liquid bath after passage through the trailing protective gas chamber, entry of liquid of the liquid bath through the exit lock into the gas discharge chamber to a far extent being avoidable thereby.

For making available a gas discharge as defined as possible, preferably a gas supply for supply of the reaction gas with a given gas composition into the gas discharge chamber is provided for. Preferably, however, at least part of the supplied gas amount is supplied to the protective gas chamber where it acts as protective gas. Thereafter, the gas moves from the protective gas chamber to the container through the entry or exit lock, respectively, for acting as reaction gas there. This embodiment permit a particularly friction-free dimensioning of the entry and exit locks, respectively, without foreign gases entering the gas discharge chamber.

The amount of gas supplied to the gas discharge chamber preferably is adjustable, namely in dependence on a signal of a gas pressure sensor detecting the pressure in the gas discharge chamber.

The pressure in the gas discharge chamber can furtheron by lowered below the ambient pressure by pumping-down using a vacuum pump.

The reaction gas preferably includes argon and/or nitrogen and/or air.

A simple embodiment of the container and the electrode arrangement is possible when the electrode arrangement itself is part of the gas-proof container. Preferably, the electrode arrangement then is formed as metal tube forming a part of the gas-proof container wall.

The electrode arrangement preferably includes a plurality of partial electrodes at least partly also encompassing the continuous material, which in direction of extension of the material are disposed adjacent to one another and electrically mutually insulated. Thereby, a separate gas discharge can be generated between each individual partial electrode and the continuous material, this permitting to act against non-homogeneities in the intensity of treatment along the length of the electrode arrangement.

The current provided by means of a current source, for the gas discharge preferably is dimensioned such that the gas discharge is a glow discharge. Herein it is preferred that the voltage provided by the current source is a direct voltage such that the electrode arrangement is switched as anode and the continuous material—as cathode. Thereby the gas ions generated in the gas discharge in the plasma impinge on the continuous material and thus cause a particularly intense treatment.

For adjusting the treatment of the continuous material to a desired intensity, preferably a temperature sensor is provided for which detects the temperature of the continuous material as directly as possible after treatment. The current provided for the gas discharge, by the current source then is adjusted, regulated in particular, in dependence on the detected temperature.

A particularly uniform treatment of the continuous material can be achieved in that vibrations of the continuos material with respect to the electrode arrangement are dampened by means of a attenuation means provided therefor.

BRIEF DESCRIPTION OF DRAWINGS

In the following preferred embodiments of the present invention will be described in more detail With reference to the drawings. Herein.

DETAILED DESCRIPTION OF PREFERRED EMBODIMENT

Figure 1:
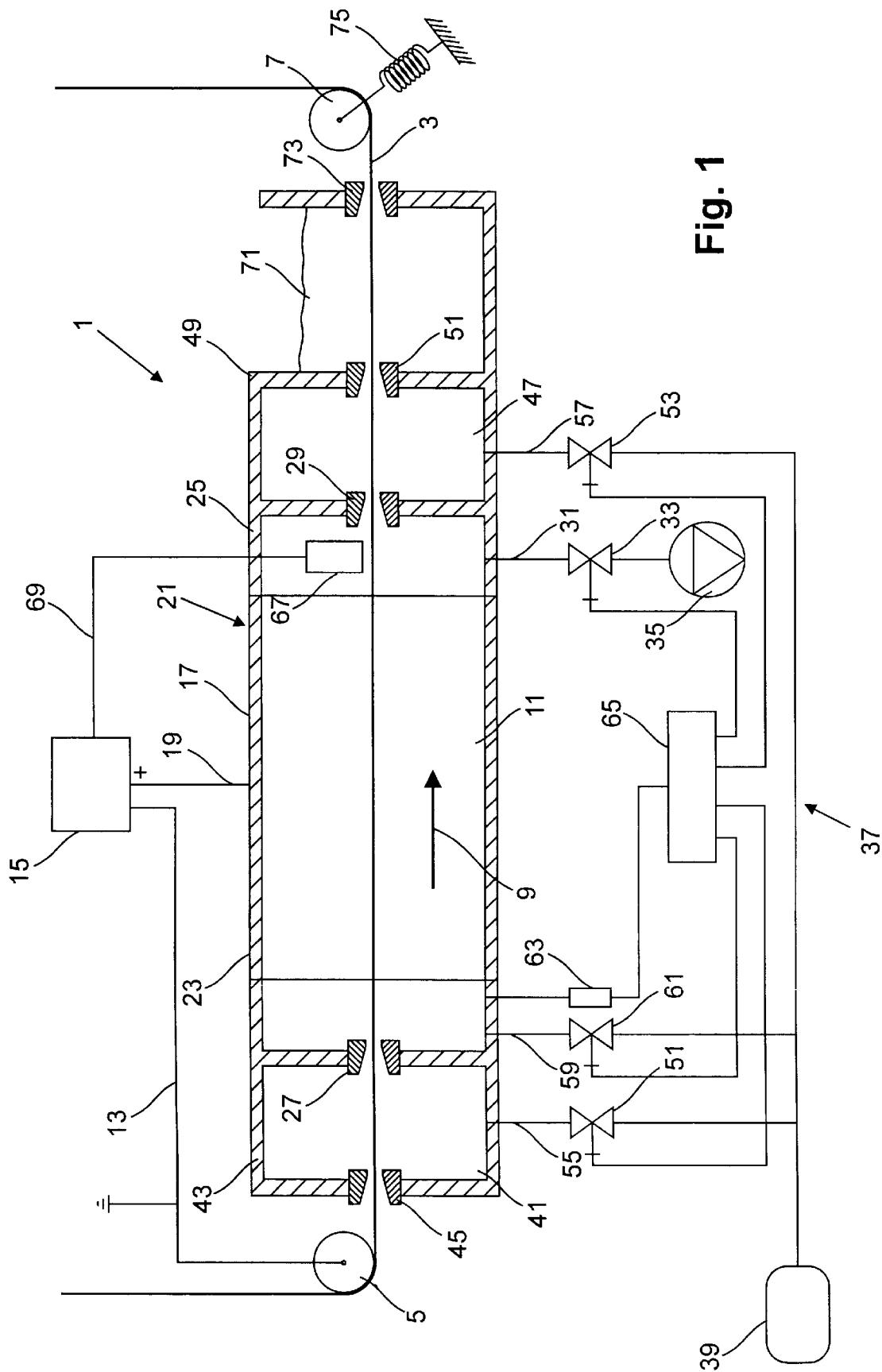
FIG. 1 in schematic view shows a first embodiment of the apparatus in accordance with the present invention, used for softannealing of wire material

FIG. 1 shows an apparatus 1 in accordance with the present invention, through which a continuous material, namely a copper wire, to be treated is transferred. With respect to the apparatus 1 said wire 3 is supported by means of an inlet-side guide roller 5 and an outlet-side guide roller 7. A drive means not shown moves said wire along its direction of extension into a direction indicated by an arrow 9. The treatment of said wire 3 is carried out in a gas discharge chamber 11 in which a gas discharge surrounding said wire 3 can be generated. During said gas discharge said wire acts as cathode for which purpose it is connected through the inlet-side guide roller 5, a frictional contact not shown and a current line 13 to a current source 15. Said current line 13 furthermore lies on mass potential of the apparatus. The anode of the gas discharge is formed by a circular cylindrical steel tube 17 which centrally intersperses the said wire 3. Said steel tube 17 is electrically connected to a positive pole of said current source 15 through a line 19. By the voltage provided by said current source 15 a gas discharge can be ignited in said gas discharge chamber 11, which then will burn uniformly in that a correspondingly dimensioned and preferably adjustable pre-resistor in said current source limits the discharge current.

To be able to provided for a gas atmosphere suitable for the desired gas discharge, in said gas discharge chamber, the latter is surrounded by an essentially gas-proof vacuum tank 21. Therein, said steel tube 17 itself is part of said vacuum tank 21. By means of a gas-proof flange connection insulation pieces 23 and/or 25, respectively, are connected the front-face ends of said steel tube 17, wherein said insulation piece 23 facing said leading guide roller 5 supports an entry lock 27 for said wire 3 and said insulating piece 25 facing said trailing guide roller 7 supports an exit lock 29 for said wire 3.

Said entry lock 27 and said exit lock 29 respectively are formed by a drawing plate out of diamond or another hard material. Such drawing plates also referred to as drawing die or drawing hole, usually are used for transformation of said wire 3 during drawing of the wire. The inner diameter of said drawing plates 27, 29 therein is dimensioned so small that the gas passage in a gap between wire 3 and drawing plate 27, 29, is as low as possible, and it is dimensioned so large that the friction between plate 27, 29 and wire 3 also is low. Said vacuum tank 21 formed out of said steel tube 17, said insulation pieces 23, 25, said entry lock 27 and said exit lock 29 and encompassing said gas discharge chamber 11 can be evacuated through an evacuation line 31, a throughput-controllable valve 33 and a vacuum pump 35.

As reaction gas for the gas discharge nitrogen is used which is taken by a gas supply 37 from a reservoir 39 and is supplied to said vacuum tank 21. In order to avoid entry of ambient air into said gas discharge chamber 11 through said locks 27, 29, a protective gas chamber 41 is disposed in front of said entry lock 27, which is passed by said wire 3 prior to its entry into said tank 21 and which is encompassed by a continuation 43 of said insulation piece 23 which is sealed with respect to said wire by a further drawing plate 45. Having exited the tank 21, said treated wire 3 enters a protective gas container 47 encompassed by a continuation 49 of said insulation piece 25 sealed with respect to said wire 3 by a further drawing plate 46. For filling said protection gas containers 41 and 47 with nitrogen, said gas supply 37 comprises supply lines 155 and 53, respectively, connected to said reservoir 39 by throughput-controllable valves 51 and 53, respectively. From said protective gas containers 41 and 47 the nitrogen moves through said locks 27 and 29 into the said tank 21 from which it again is pumped out over said evacuation line 36, said throughput-controllable valve 33 and said vacuum pump 35. Said gas supply 37 further includes a further supply line 59 through which nitrogen from said reservoir 39 can be supplied directly to said tank 21 via a further throughput-controllable valve 61. The gas pressure in said tank 21 is detected by a pressure sensor 63 whose output signal is fed to a control means 65 of said gas supply 37. In dependence on the detected gas pressure in said tank 21 said control means 65 selects said throughput-controllable gas valves 33, 51, 53 and 61 for adjusting a gas pressure in the tank, favorable for the gas discharge in said gas discharge chamber 11.

Within said tank 21 a radiation sensor 67 directed to said wire 3 is located in an area close to the front end of said gas discharge chamber, facing said trailing guide roller 7, said radiation sensor detecting the heat radiation emitted by said wire 3 for determining the temperature of said wire 3 essentially directly after its treatment in said gas discharge chamber 11 therefrom. A corresponding temperature signal is feed via a signal line 69 to said current source 15 which then adjusts the current made available through said current lines 13, 17, for maintenance of the gas discharge in dependence on temperature signal such that said wire 3 after its treatment by the gas discharge shows a desired temperature.

Said wire 3 which can be very hot directly after its treatment enters the container 47 also filled with protective gas via said exit lock 29. In said protective gas container 47 the nitrogen is under increased pressure which can also lie above ambient pressure e.g. By convection said heated wire 3 transmits at least part of its heat to the nitrogen in said protective gas chamber 47, this cooling down said wire 3. From said protective gas chamber 47 through said drawing plate 51 said wire 3 enters a water bath 71 in which it is finally and completely cooled down to ambient temperature. From said water bath 71 said wire 3 exits through another drawing plate 73 and comes into contact with ambient air. Because of cooling in said protective gas chamber 47 and said water bath 71 a reaction which may become obvious by tarnish colors e.g., of said heated treated wire 3 with the ambient air is avoided.

Said outlet-side guide roller 7 is suspended on an elastical attenuation spring 75 keeping said wire 3 in cooperation with the supply device not shown, for said wire 3 under mechanical tension such that vibrations of said wire 3 with respect to said steel tube 17 acting as anode of the gas discharge are dampened. Thereby, uniform burning of the gas discharge and thus uniform treatment of said wire 3 is propagated.

Using the above described apparatus wires hardened by initial drawing were soft-annealed so that they subsequently again permitted an extension of more than 30 percent. Herein, in particular wire with a diameter of 0.25 mm was fed through the apparatus with a speed of 100 m/min, wire with 0.5 mm diameter—with a speed of 50 to 85 m/min and wire with 1 mm diameter—with 15 to 20 m/min. For the gas discharge the parameter were varied as well. Thus, argon was used with 7.9 mbar and a current of 1 A was feed at 800 V. As well N2 was used at 1.8 to 4.9 mbar, 0.5 to 1.0 A at 850 to 1100 V as well as air at 2.0 mbar and 0.5 to 1.0 A at about 780 to 1000 V. Under all described conditions the wires could be treated successfully, i.e. soft-annealed so that they permitted extension by more than 30 percent.

In the following a modification of the apparatus shown in FIG. 1 will be explained. Components corresponding with respect to its construction and its function are referred to by the reference numerals of FIG. 1, for sake of distinction however provided with a letter. For explanation, reference is made to the entire past description.

Figure 2:
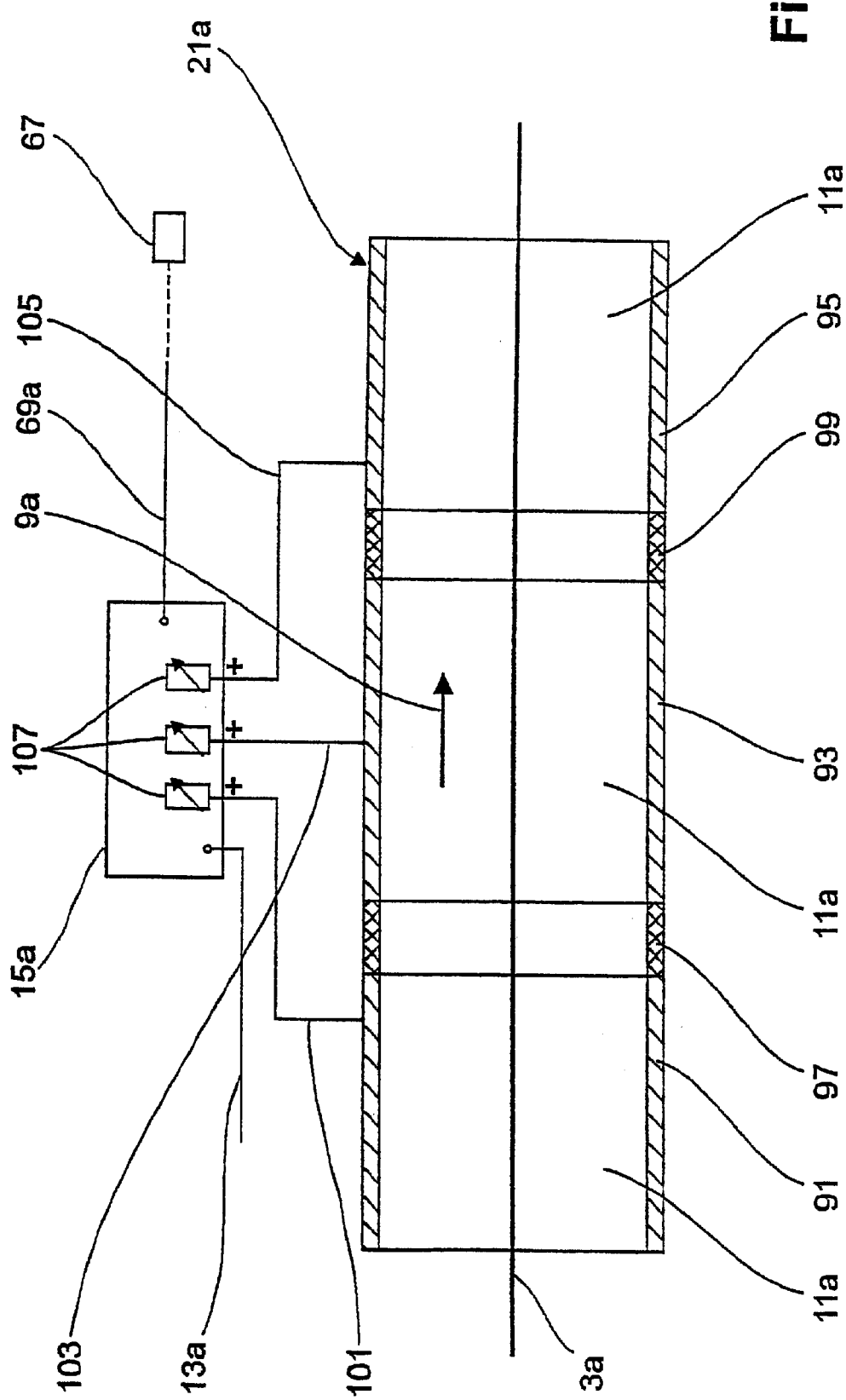
FIG. 2 shows an electrode arrangement of another embodiment of the apparatus in accordance with the present invention.

In FIG. 2 a modified embodiment of the electrode arrangement is shown. Herein, said electrode arrangement includes three partial electrodes 91, 93 and 95 each of them being formed from a steel tube. A wire 3a to be treated centrally extends through said steel tubes 91, 93 and 95 and said steel tubes 91, 93, 95 are arranged with axial distance to one another. The axial distance between said three tubes 91, 93, 95 is respectively bridged by insulation tubes 97 and 99 flanged in gas-proof manner so that said steel tubes 91, 93, 95 are arranged in electrically mutually insulated manner. Said steel tubes 91, 93 and 95 and said insulation tubes 97 and 99 together form a tube part of a gas-proof tank 21a.

Each of said steel tubes 91, 93, 95 encompasses a separate gas discharge chamber 11a. In order to respectively create a gas discharge in said gas discharge chambers 11a, each of said steel tubes 91, 93, 95 is connected to a current source 15a via an individual current line 101, 103 and 105, respectively. Said current source 15a comprises an individual adjustable pre-resistor 107 shown schematically, correlated to each of said current lines 101, 103, 105. Said current source 15a further is in contact with said wire 3a to be treated via a current line 13a. A temperature sensor 67a delivers a temperature signal corresponding to the temperature of said wire, via a signal line 69a to said current source 15a. Said current source 15a controls the currents fed to the individual gas discharges in said gas discharge chambers 11a via said current lines 101, 103 and 105 by change of the individual pre-resistors 107 such that the currents supplied to the individual gas discharges are equal to one another and thus the gas discharges burn with respectively same intensity. The entire current of the three gas charges and thus the overall intensity of the treatment of said wire 3a is adjusted in dependence on the temperature signal supplied via said signal line 69a in such way that said wire 3a after its treatment has a desired temperature. The intensity of treatment of said wire 3a namely changes along the length of the anode. Therefore, by the three short anodes 91, 93, 95 a more uniform treatment of said wire 3a over the entire length is achieved than would be possible using one single anode of triple length.

The above-described embodiments of the apparatus are used for soft-annealing of copper wire. Said apparatus, however, can also be used for cleaning the surface of said copper wire for e.g. achieving better adhesion of an insulating material, an insulating varnish e.g., on said wire. Furthermore, by means of the apparatus in accordance with the present invention any metallic wire material as e.g. used for manufacturing arbitrary objects out of wire can be treated and cleaned in particular. Also a use for surface modification and/or surface activation of continuous material is conceivable. Furthermore, using the apparatus also other continuous material not having circular cross-section can be treated. In such case only the shape of the electrode arrangement and the geometry of the locks had to be adapted to the cross-section of said continuous material.

Using the apparatus in accordance with the present invention also non-metallic but electrically conductive materials, carbon fibers e.g., can be treated.

A further use of the apparatus lies in heating of the conducting core of a cable, a current cable in particular, prior to its coating with an insulating material directly prior to entry of the core into an extrusion device in particular for applying said insulating material.

For intensifying cooling of the continuous material to be treated, after exit from said gas discharge chamber, the gas can be separately cooled in said protective gas chamber, by a cooling spiral arranged therein in particular. However, it also is possible to supply cooling protective gas, in liquid form in particular, like liquid nitrogen e.g., to said protective gas chamber.

In the above described embodiments the electrode arrangements are formed by steel tubes which themselves form part of the vacuum container for said gas discharge chamber. This results in a simple construction of the container and the electrode arrangement. However, herein at least on container part, namely the insulation pieces 23, 25 are to be provided for insulating the electrode arrangement from said locks which are touched by the continuous material moved therethrough. In particular in case of more complex embodiments of said electrode arrangement it can then be advantageous to manufacture the container in total out of metal and to connect it to mass together with said continuous material. Then, said electrode arrangement is manufactured as separate component which is held in the interior of the container and therein is electrically insulated therefrom.

It further is conceivable not to form said electrode arrangement by continuous tubes but to use another material, like e.g. wire mesh, therefor. Then, namely more complicated electrode geometry can be easier produced and intense gas exchange with the gas discharge chamber can occur through openings in the electrode material.

What is claimed is:

1. An apparatus for treatment, cleaning or heating of electrically conductive continuous material during its movement in its direction of extension through said apparatus, the apparatus comprising:
    contact means for creating an electrical contact with said moving continuous material;
    an electrode arrangement configured with a distance to said continuous material and at least partly to encompass the latter;
    a gas discharge chamber adapted to be filled with a reaction gas, the gas discharge chamber located between said continuous material and said electrode arrangement; and
    means for applying a pulsed direct voltage between said contact means and said electrode arrangement to create an electric gas discharge for treatment of said continuous material.

2. An apparatus as defined in claim 1, wherein said electrode arrangement shows a tube cylinder geometry by which said continuous material extends essentially in axially straight line.

3. An apparatus as defined in claim 1, wherein a container encompassing said gas discharge chamber in essentially gas-proof manner is provided for into which said continuous material enters during its movement through an entry lock and from which is exits through an exit lock.

4. An apparatus as defined in claim 3, wherein said entry lock and/or said exit lock include/s a drawing plate used for wire drawing, with an inside diameter harmonized to an outside diameter of said continuous material such that said outside diameter of said continuous material essentially is not reduced during passage of said drawing plate.

5. An apparatus as defined in claim 3, wherein a leading protective gas chamber limited by said entry lock and filled with a protective gas is provided for from which said continuous material enters into said container and/or that a trailing protective gas chamber limited by said exit lock and filled with protective gas is provided for into which said continuous material enters upon its treatment, for its cooling.

6. An apparatus as defined in claim 5, wherein said protective gas is under higher pressure than the reaction gas and under higher pressure than standard pressure.

7. An apparatus as defined in claim 5, wherein for cooling said treated continuous material a liquid bath is provided for into which said continuous material enters upon exiting from said trailing protective gas chamber.

8. An apparatus as defined in claim 3, wherein a gas supply for supply of said reaction gas having a given gas composition, into said gas discharge chamber is provided for.

9. An apparatus as defined in claim 8, wherein said gas supply includes a line for introducing a gas as protective gas into said leading and/or trailing protective gas chamber of said container, through which said gas enters said container in order to there form said reaction gas.

10. An apparatus as defined in one of claim 8, wherein said supplied amount of gas can be regulated in dependence on a gas pressure detected by means of a gas pressure senso,r of said reaction gas in said gas discharge chamber.

11. An apparatus as defined in claim 8, wherein said reaction gas includes argon, nitrogen or air.

12. An apparatus as defined in claim 3, wherein said electrode arrangement is part of said gas proof container.

13. An apparatus as defined in claim 1, wherein said electrode arrangement includes a plurality of partial electrodes arranged adjacent to one another in direction of extension of said continuous material and electrically insulated from one another, to which the electric voltage can be applied respectively.

14. An apparatus as defined in claim 3, wherein a current source is provided for whose one terminal is connected to said contact means and whose other terminal is connected to said electrode arrangement and that the current made available by said current source is dimensioned such that the gas discharge is a glow discharge.

15. An apparatus as defined in claim 14, wherein said electrical voltage is a pulsed direct voltage, and said electrode arrangement is switched as anode and said continuous material is switched as cathode of said gas discharge.

16. An apparatus as defined in claim 14, wherein a temperature sensor for detecting the temperature of said continuous material in said gas discharge chamber or essentially during exit from said gas discharge chamber is provided for and the current is adjustable depending on the detected temperature.

17. An apparatus as defined in claim 1, wherein an attenuation means for dampening vibrations of said continuous material with respect to said electrode arrangement is provided for.

18. A method for treatment of electrically conductive continuous material bar means of the apparatus as defined in claim 1, the method comprising:
    making available said continuous material and transferring said continuous material in its direction of extension;
    making available an electrical gas discharge in a gas discharge chamber by applying a pulsed direct voltage between said continuous material and an electrode arrangement; and
    passing said continuous material through said gas discharge chamber for treatment of said continuous material during its transfer through said gas discharge chamber.

19. The method as defined in claim 18, wherein said material is metallic wire material and said steps are performed for soft-annealing said wire material prior to or after a drawing step for reduction of cross-section of said wire material, for cleaning a surface of said wire material prior to a coating step for coating said wire material with an insulation material, or for heating said wire material.

20. The method of claim 19, wherein said material is copper wire.

* * * * *